United States Patent [19]

Hirano et al.

[11] Patent Number: 5,519,720
[45] Date of Patent: May 21, 1996

[54] SEMICONDUCTOR LIGHT EMITTING DEVICE

[75] Inventors: Ryoichi Hirano; Etsuji Omura; Akira Takemoto; Kimio Shigihara, all of Itami, Japan

[73] Assignee: Mitsubishi Denki Kabushiki Kaisha, Tokyo, Japan

[21] Appl. No.: 177,466

[22] Filed: Jan. 5, 1994

[30] Foreign Application Priority Data

Mar. 4, 1993 [JP] Japan .................................. 5-043123
Aug. 20, 1993 [JP] Japan .................................. 5-206036

[51] Int. Cl.$^6$ ........................... H01S 3/043; H01S 3/18
[52] U.S. Cl. ................................. 372/36; 372/43
[58] Field of Search ..................... 372/36, 34, 43; 257/712

[56] References Cited

U.S. PATENT DOCUMENTS

| | | | |
|---|---|---|---|
| 4,567,598 | 1/1986 | Noguchi et al. | 372/36 |
| 4,763,335 | 8/1988 | Chamuel | 372/36 |
| 4,818,099 | 4/1989 | Preikschat et al. | 372/36 |
| 4,995,687 | 2/1991 | Nagai et al. | 257/712 |
| 4,996,169 | 2/1991 | Lee | 372/36 |
| 5,148,322 | 9/1992 | Aoyama et al. | 359/900 |

FOREIGN PATENT DOCUMENTS

| | | | |
|---|---|---|---|
| 0042286 | 3/1983 | Japan | 372/36 |
| 0168289 | 10/1983 | Japan | 372/36 |
| 0092687 | 5/1985 | Japan | 372/36 |
| 61-29188 | 2/1986 | Japan . | |
| 2174179 | 7/1990 | Japan . | |
| 3-62983 | 3/1991 | Japan | 372/43 |
| 424978 | 1/1992 | Japan . | |
| 0094582 | 3/1992 | Japan | 372/36 |

*Primary Examiner*—Rodney B. Bovernick
*Assistant Examiner*—Robert McNutt
*Attorney, Agent, or Firm*—Leydig, Voit & Mayer

[57] ABSTRACT

A semiconductor light emitting device includes a semiconductor light emitting element mounted on a package stem via a radiating heatsink block, the light emitting point of the light emitting element being positioned on the central axis of the stem and at or near the center of mass of the heatsink block. Another light emitting device includes a light emitting element mounted on a stem via a heatsink block, the light emitting point of the element being positioned on the central axis of the stem with only a portion of a lower surface of the heatsink block close to the central axis of the stem attached to the stem. The movement of the light emitting point with temperature variations is suppressed. Another light emitting device includes a laser chip element mounted on a package stem via a heatsink block, the laser chip element being mounted on the heatsink block so that the emitted light forms an angle θ with a surface of the stem and the position and angle of the emitted light do not vary when the temperature changes.

6 Claims, 10 Drawing Sheets

SEMICONDUCTOR LIGHT EMITTING DEVICE

FIELD OF THE INVENTION

The present invention relates to a semiconductor light emitting device and, more particularly, a structure in which there is no movement of the light emitting point of the device even when the temperature varies.

Background of the Invention

Figure 5:
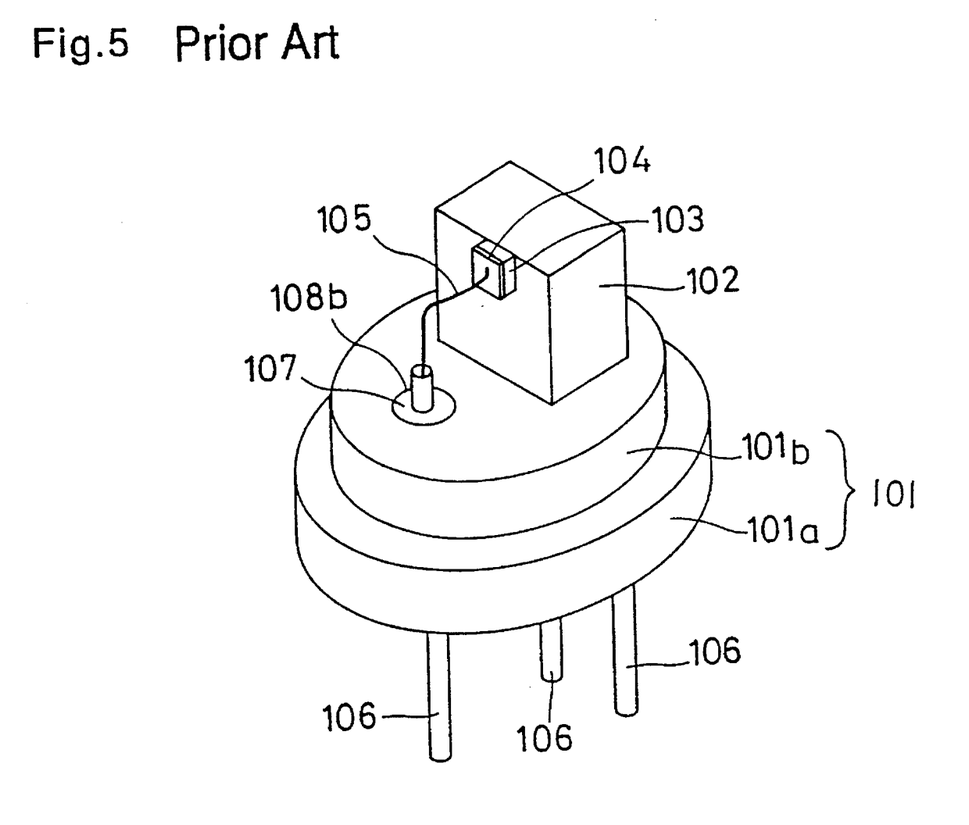
FIG. 5 is a perspective view illustrating the prior art ridge type semiconductor light emitting device.
Figure 6A:
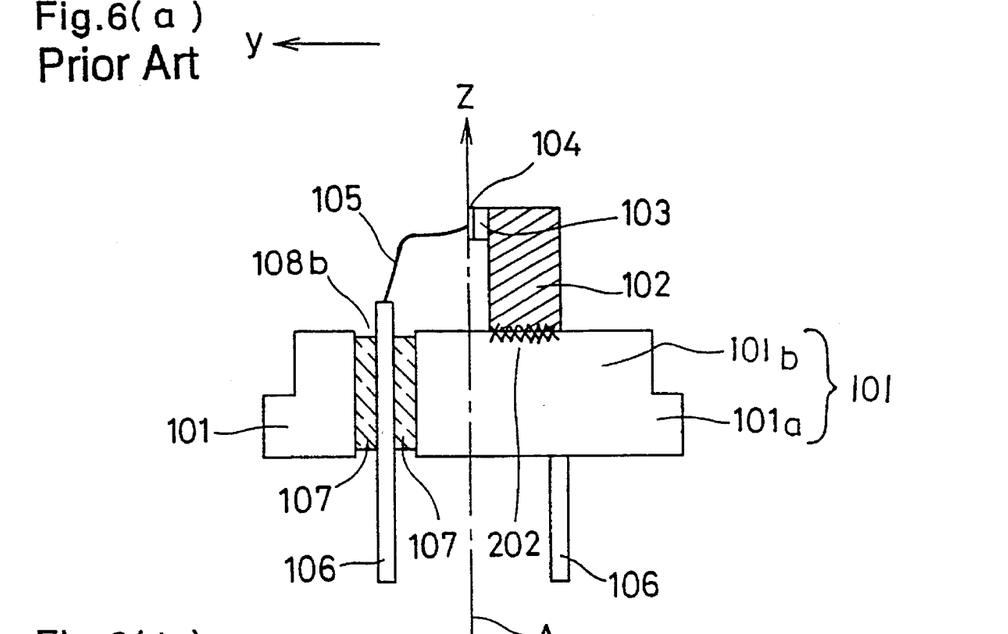
FIG. 6(a) and 6(b) are sectional views illustrating a prior art ridge type semiconductor light emitting device.
Figure 6B:
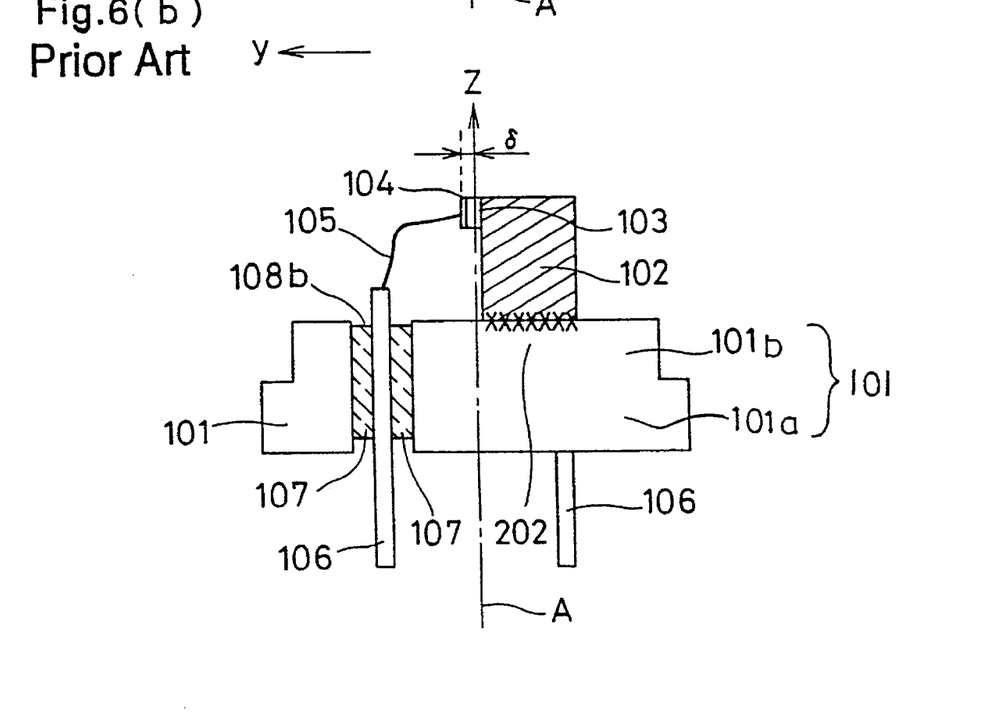

FIG. 5 is a perspective view of a prior art semiconductor light emitting device and FIGS. 6(a) and 6(b) are cross-sectional views of the device. FIG. 6(a) is a schematic cross-sectional view illustrating a semiconductor laser device mounted on a package stem via a heat sink at room temperature and FIG. 6(b) is a schematic cross-sectional view illustrating the heat sink on the package stem thermally expanded by the heat of the semiconductor laser device. In the figures, an iron stem 101 has a diameter of 0.5 to 5.6 mm, a thickness of 1.0 to 2.0 mm, and a central axis A, and a heat radiating silver block 102 has a width of 3.0 mm, a height of 2.0 mm, and a thickness of 2.0 mm. A semiconductor laser device 103 has a width of 0.3 mm, a height of 0.5 mm, a thickness of 0.1 mm, and a light emitting point 104. A lead 106, a supporting leg for the semiconductor light emitting device, comprises a Fe-Ni alloy having a diameter of 0.3 mm. A glass 107 is melted and solidified to fix a gold lead 106. A lead hole 108b penetrates the iron stem 101 for passing the lead 106 fixed with the glass 107 through the iron stem 101. A solder 202 fixes the silver block 102 on the iron stem 101 over the whole contact surface of the iron stem 101. For clarification, crosses (X) mark the surface where the silver block 102 is soldered to the iron stem 101.

After soldering the silver heat sink 102 on the iron package stem 101 with silver solder, the semiconductor laser device 103 is soldered to the silver heat sink 102 with a solder comprising tin/gold (AuSn), silicon/gold (AuSi), indium (In), and the like. Three leads 106 hold the iron stem 101 and the silver block 102. One lead 106 passes through the lead hole 108b and is connected to the semiconductor laser device 103 via a bonding wire 105, and another lead 106 is connected to the semiconductor laser device 103 via the silver block 102. Conventionally, as illustrated in FIG. 6(a), the iron stem 101 has a cylindrical configuration having a step 80 with a cylinder 101b having a smaller diameter disposed on a cylinder 101a having a larger diameter so that it is easy to attach a semiconductor laser module. The iron stem 101 is mounted so that the light emitting point 104 is positioned on the central axis A of the iron stem 101. The linear expansion coefficient, the thermal conductivity, the specific electrical conductivity, and Young's modulus of silver and iron employed in this prior art device are as shown in the Table 1.

TABLE 1

|  | silver | iron |
| --- | --- | --- |
| linear expansion coefficient | $0.193 \times 10^{-4}/°K.$ | $0.138 \times 10^{-4}/°K.$ |
| thermal conductivity | 427 W/m °K. | 80.3 W/m °K. |
| specific electrical conductivity | $0.103 \times 10^8$ S/m | $0.629 \times 10^8$ S/m |
| Young's modulus | $76 \times 10^9$ N/m$^2$ | $193 \times 10^{19}$ - $200 \times 10^{19}$ N/m$^2$ |

As shown in Table 1, the linear expansion coefficient of silver is about 1.4 times that of iron, the thermal conductivity of silver is about 5.3 times that of iron, the specific electrical conductivity of silver is about 6.1 times that of iron, and the Young's modulus of silver is about $0.4 \times 10^{-10}$ times that of iron.

Generally, thermal expansion coefficient represents a proportional expansion of a material as a function of temperature change when the material is under a constant pressure. The expansion coefficient varies with temperature and pressure. The volume thermal expansion coefficient α, i.e., the volume change, is represented by $$\alpha = (dV/d\theta)/V_o$$

where V is volume, θ is temperature, and $V_0$ is the volume at a temperature of 0° C. A linear thermal expansion coefficient β, the change in length with temperature, is $$\beta = (dL/d\theta)/L_o$$

where L is length, θ is temperature, and $L_0$ is the length at a temperature of 0° C. Although B is dependent on direction in an anisotropic material, the relation of α=3β applies to an isotropic material. Quartz and invar are known as materials having quite a small thermal expansion coefficient.

In the semiconductor light emitting device of FIGS. 5 and 6(a), in order to effectively radiate heat generated in the semiconductor laser device 103, after mounting the semiconductor laser device 103 on the heat sink 102 comprising silver, copper, and the like and having a high thermal conductivity, the heat sink 102 is mounted on the package stem 101 that is usually made of iron. The lead 106 penetrating through the package stem 101 must be fixed to and electrically insulated from the package stem 101 so a glass 107 is used for the mounting. The thermal expansion coefficient of glass is smaller than for silver and, if silver is used for the package stem 101, the glass cracks after being melted and solidified. Because iron has a small linear expansion coefficient, i.e., about two thirds that of silver, and has no cracking problem, it is preferable to use an iron package stem.

The linear expansion coefficient of quartz is $5.5 \times 10^{-7}/°K.$ and the linear expansion coefficients of silver and iron are, respectively, about 35 and 25 times that of quartz. The linear expansion coefficient of silver is about 1.4 times that of iron and the thermal conductivity of silver is about 5.3 times that of iron. Thus, the linear expansion coefficient and the thermal conductivity of silver are much larger than those of iron. When silver is employed for the package stem 101, the melted glass cracks when cooled and solidified. When the molten glass is poured into the lead hole 108b, heat is easily conducted due to the large thermal conductivity of silver and the temperature of the silver in the vicinity of the lead hole 108b rapidly rises.

On the other hand, if iron is employed for the package stem 101, molten glass does not crack when cooled and solidified. When the molten glass is poured into the lead hole 108b, heat is not easily conducted due to the small thermal conductivity of iron so the temperature increase of iron in the vicinity of the lead hole 108b is restricted to a narrow region, lower than the silver stem, whereby the volume of the iron is changed only slightly.

In addition, since the thermal conductivity of silver is much larger than that of iron, when silver is used for the stem, the molten glass is rapidly cooled and the difference between temperatures in internal portions of the glass increases in a short time whereby the difference in thermal expansion increases.

Conventionally, the iron stem 101 that has the semiconductor laser 103 and the silver block 102 mounted thereon includes optical parts such as lenses and optical fibers in a module in which a laser beam emitted from the semiconductor laser 103 is extracted through the optical fiber. Generally, the range of temperature within which this semiconductor laser module is used is around 0° C. to 80° C. When the temperatures of the iron stem 101 and the silver block 102 significantly change due to heat generation by the semiconductor laser device 103, as schematically illustrated in FIG. 6(b), the silver block 102 is thermally expanded almost isotropically with its center of gravity as the center of expansion. The light emitting point 104 of the semiconductor laser device 103 mounted on the silver block 102 moves from the central axis A of the iron stem 101 by an amount δ in the y direction.

When the thickness of the silver block 102 in the y direction is about 2 mm, the movement δ from the central axis A of the iron stem 101 is about 0.5 μm for a temperature difference of 30° K., as verified by the inventors' experiment.

Because a lens is included in the semiconductor laser module and a laser beam is transferred through the lens to an optical fiber, any movement of the light emitting point 104 due to thermal expansion is enlarged by the magnification factor of the lens at the plane of incidence of the optical fiber. A lens of five or six power magnification is conventionally employed so that a movement δ=0.5 μm of the light emitting point 104 corresponds to a movement of 2.5 to 3.0 μm at the incidence plane of the optical fiber. Because the diameter of the core of the optical fiber through which light propagates is less than 10 μm, a movement of 2.5 to 3.0 μm at the incidence plane of the optical fiber is too large to be ignored.

Even if the light output from the semiconductor laser device 103 is kept constant by adjusting the voltage and the current applied to the semiconductor laser 103, the output light cannot be kept constant because of a large change in the location of the output light so that light output from the optical fiber is unfavorably changed.

When the package stem 101 is made of the same material as the radiating heat sink 102, for example, when a silver stem 101 and a silver block 102 are used, the expansion of the silver stem cancels that of the silver block 102, resulting in no net movement of the light emitting point 104 of the semiconductor laser 103. However, for the reason described above, silver cannot be used for the stem.

As described above, since, in the conventional combination of the block material and the stem material, the movement of the laser light emitting point due to the difference in thermal expansion coefficients depends on the temperature change, the light output in the module fiber unfavorably varies with temperature.

Japanese Published Patent Application 61-29188 discloses a laser diode container in which a protrusion 27 is provided at an end of a mount base 24 part of a stem 23 on which a heat sink 22 with a laser diode 21 is mounted. The heat sink 22 is disposed in contact with protrusion 27 whereby the position of the heat sink 22 is determined with high precision. However, in this prior art device, stable light output is not obtained because the position of the light emitting point moves due to thermal expansion.

Japanese Published Patent Application 2-174179 discloses a light emitting device and a production method therefor in which, by processing of a heat sink 5 fixed on a stem 3 via a submount 8, the position of a semiconductor laser element 9 is determined precisely. However, stable light output is not obtained because the position of the light emitting point moves due to thermal expansion.

Japanese Published Patent Application 4-24978 discloses a thin light emitting semiconductor element 3 with a radiating block 30 penetrating a resin stem 31. However, in this prior art device, stable light output is not obtained because the position of the light emitting point moves due to thermal expansion.

Figure 9A:
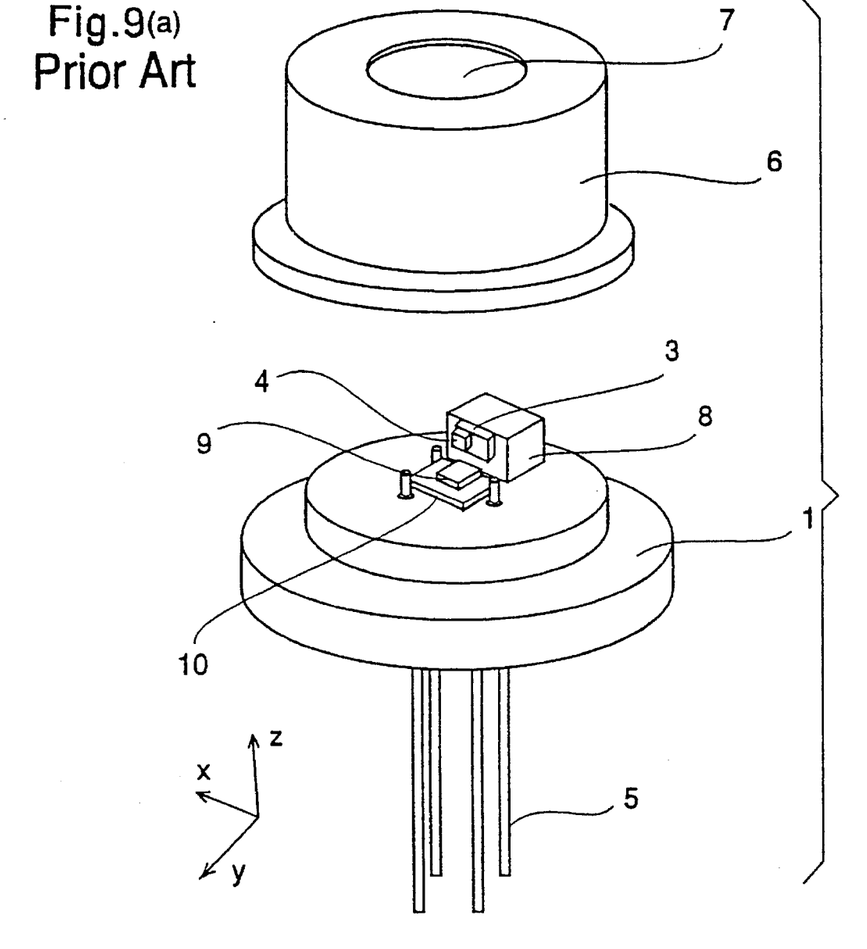
FIG. 9(a) and 9(b) are a perspective view and a sectional view illustrating a structure of a prior art semiconductor laser.
Figure 9B:
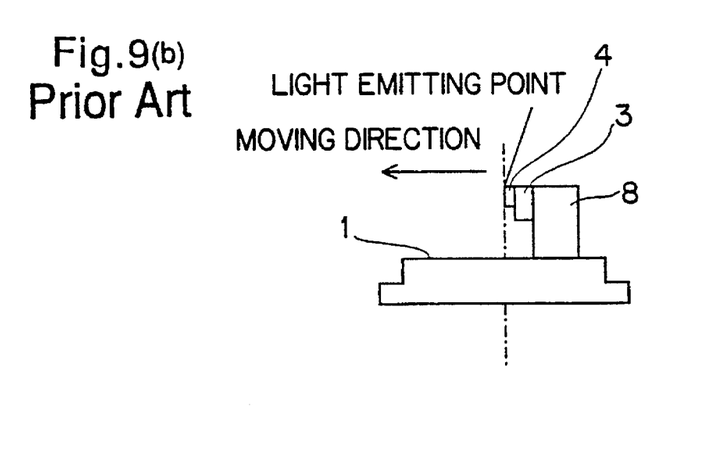

FIGS. 9(a) and 9(b) show a method of constructing a semiconductor laser according to the prior art. In these Figures, an Ag block 8 for heat radiation is provided on the Fe stem 1 for mounting a semiconductor laser chip 4 on the Fe stem 1. A cubic boron nitride submount 3 is used for mounting the laser chip 1 on the Ag block 8. Pins 5 are fixed to the stem 1 for applying a signal to the semiconductor chip 4. A monitor photodiode 9 is disposed on a monitor photodiode submount 10. A cap 6 enclosing the elements including the chip 4 is mounted on the Fe stem 1. Reference numeral 7 designates a glass window. In this prior art laser shown in FIG. 9, the cap 6 is actually welded to the stem 1. The Ag block 8 is soldered to the Fe stem 1.

Figure 10:
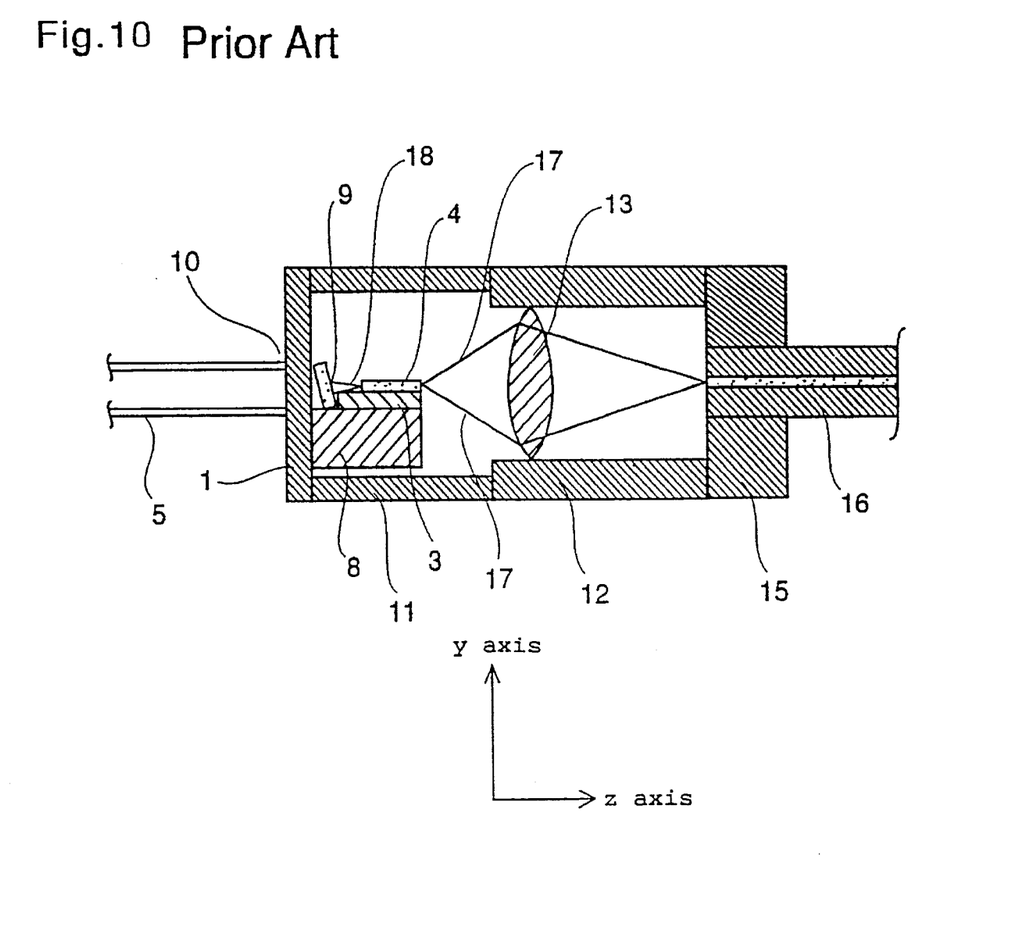
FIG. 10 is a cross-sectional view illustrating a prior art semiconductor laser module.

The prior art semiconductor laser device is incorporated into a module. FIG. 10 shows a cross-section of the module. In order to simplify the figure, the cap 6 of the semiconductor laser is omitted. In FIG. 10, a semiconductor laser holder 11 holds the semiconductor laser chip 4. A lens 13 is held by a lens holder 12. An optical fiber 16 is held by an optical fiber holder 15. Light emitted from the front surface of the laser chip 4 follows a path 17. Light emitted from the rear surface of the laser chip 4 follows a path 18.

When a current flows to the semiconductor laser chip 4 through the pins 5, laser light is emitted from the semiconductor laser chip 4 and is incident on the optical fiber 16 through the lens 13. The lens 13 collects the light. The current (monitor current) generated by the monitor photodiode 9 flows throughout an external APC (automatic power control) circuit and the driving current of the semiconductor laser 4 is controlled so that the monitor current is constant and, thereby, front facet light output is controlled and made constant. The semiconductor laser 4 has a strong temperature dependency characteristic and, for example, under a constant driving current, the light output is changed at a rate of −1.3 mW/°C. and the APC circuit utilizing a monitor current is needed.

When the prior art module including a laser device and an optical fiber is operated with an APC, a constant light output from the optical fiber is assumed to be achieved regardless of the temperature change. In the module of FIG. 10, however, when the temperature varies in a range of 5° C. to 45° C., the optical fiber output changes by about 0.5 to 1.0 dB. That variation in the optical fiber output is called tracking error and it is caused by positional deviation of a semiconductor laser chip occurring with a temperature change. The semiconductor laser chip 4 moves in the y direction in FIG. 3 with a temperature change at a rate of 0.016 μm/deg. When the semiconductor laser chip 4 moves, the optical path 17 varies and the focal position also changes, thereby changing the proportion of the laser light input to the optical fiber 16. The optical coupling efficiency between the semiconductor laser chip 4 and the optical fiber 16 varies. When the value of the tracking error caused by the change in the optical coupling efficiency is measured, it is found that when the laser chip 4 moves by 0.2 μm, there is a tracking error of 0.24 dB. However, this tracking error should actually be suppressed to a value below 0.5 dB for a temperature variation of about 40° C. In order to realize this same variation, movement of the light emitting point must be below 0.5 μm over a temperature range of 40° C., i.e., below 0.011 μm/deg.

This value is determined by considering that a light source movement of 0.2 μm means that the light intensity changes by ±0.056817 times. Reversely said, in order to suppress the tracking error to below 0.5 dB (±0.122018 times), assume that the moving distance of the light source is proportional to the rate of change of the light, x: 0.2 (μm)=0.122018:0.056817 x=0.42951 (μm) (per 40° C.)

Accordingly, from 0.42951/40=0.0107≈0.011 μm/deg.

SUMMARY OF THE INVENTION

It is an object of the present invention to provide a semiconductor light emitting device with an improved configuration heat sink and a method of mounting the heat sink block on a package stem.

It is another object of the present invention to provide a semiconductor light emitting device with reduced movement of the semiconductor laser chip due to temperature variations and thereby reduced temperature variations of the light output by the optical fiber, i.e., with reduced tracking error.

Other objects and advantages of the present invention will become apparent from the detailed description given hereinafter. It should be understood, however, that the detailed description and specific embodiment are given by way of illustration only since various changes and modifications within the scope of the invention will become apparent to those skilled in the art from this detailed description.

According to a first aspect of the present invention, a semiconductor light emitting device includes a semiconductor light emitting element mounted on a package stem via a heat sink with a light emitting point of the semiconductor light emitting element positioned on a central axis of the package stem and positioned at the center of gravity of the heat sink or in the vicinity thereof. With this construction, movement of the position of the light emitting point due to temperature variation is suppressed and the light output of the semiconductor light emitting device is stable.

According to a second aspect of the present invention, a semiconductor light emitting device includes a semiconductor light emitting element mounted on a package stem via a heat sink with a light emitting point of the semiconductor light emitting element positioned on the central axis of the package stem and the lower surface of the heat sink mounted on the package stem close to the central axis of the package stem. With this construction, the point of originating expansion of the heat sink approximately coincides with the light emitting point whereby movement of the light emitting point due to temperature variation is suppressed and the light output of the semiconductor light emitting device is stable.

According to a third aspect of the present invention, a semiconductor light emitting device includes a semiconductor light emitting element mounted on a package stem via a heat sink with a light emitting point of the semiconductor light emitting element positioned on the central axis of the package stem and an expansion restricting stop comprising a material different from that of the heat sink in contact with the heat sink on the package stem. With this construction, movement of the heat sink in the y direction due to thermal expansion is suppressed, movement of the light emitting point due to temperature variation is decreased, and the light output of the semiconductor light emitting device is stable.

According to a fourth aspect of the present invention, a semiconductor light emitting device includes a semiconductor laser chip element mounted on a package stem via a heat sink so that the light emitted from the chip produces an angle θ with the surface of the package stem so that the position of the emitted light does not vary when the temperature changes. Therefore, the positional deviation of the chip (light emitting point) due to thermal expansion is reduced whereby tracking error is reduced.

According to fifth aspect of the present invention, in a semiconductor light emitting device, when the distance from the center of the surface of the package stem to a position of the stem where the heat sink is attached is 11, the thickness of the heat sink is 12 and the linear expansion coefficients of the stem and the heat sink are α1 and α2, respectively:

$$\tan \theta = \frac{12}{11}, \quad \left(\frac{12}{11}\right)^2 = \frac{\alpha 1}{\alpha 2}.$$

Therefore, the positional deviation of the chip (light emitting point) due to thermal expansion is reduced whereby tracking error is reduced.

According to a sixth aspect of the present invention, in a semiconductor light emitting device, the positional deviation in the light emitting direction of the semiconductor laser chip due to the difference in the linear expansion lengths of the package stem and the heat sink is compensated by the linear expansion of a submount between the semiconductor laser chip and the heat sink. Therefore, the positional deviation of the chip (light emitting point) due to thermal expansion is reduced whereby tracking error is reduced.

According to a seventh aspect of the present invention, in a semiconductor light emitting device, when the linear expansion coefficient of the submount is α3 and the distance from the center of the heat sink on the surface of the submount to the attaching center of the semiconductor laser chip is 13, α1.11 sinθ+α2.12 cosθ=α3.13.

Therefore, the positional deviation of the chip (light emitting point) due to thermal expansion is reduced whereby tracking error is reduced.

DETAILED DESCRIPTON OF THE PREFERRED EMBODIMENTS

Embodiment 1

Figure 1A:
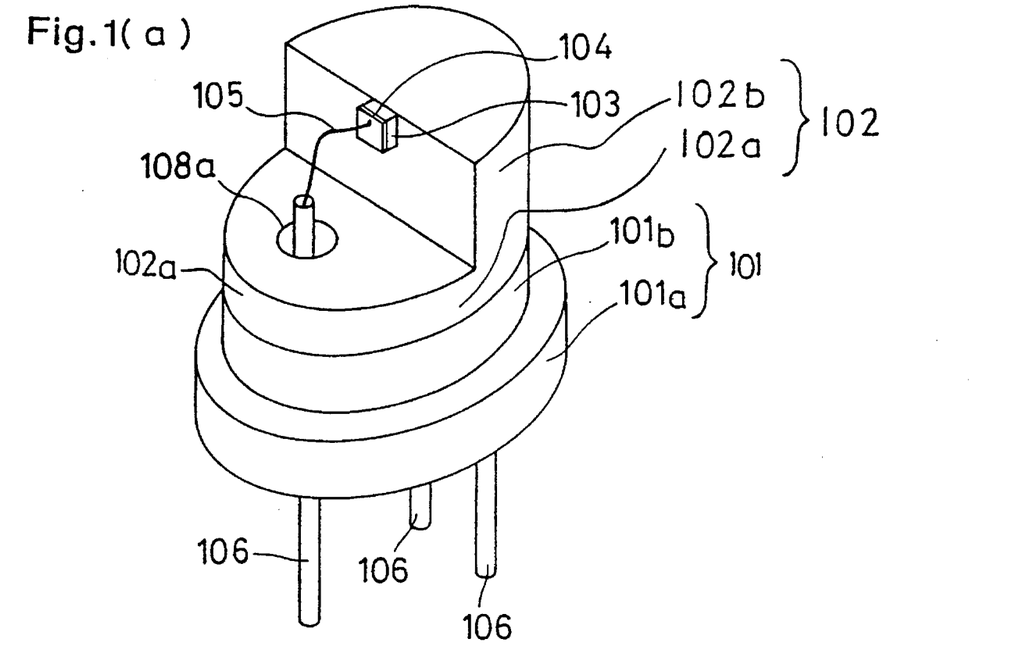
FIGS. 1(a) and 1(b) are, respectively, a perspective view and a sectional view illustrating a semiconductor light emitting device in accordance with a first embodiment of the present invention.
Figure 1B:
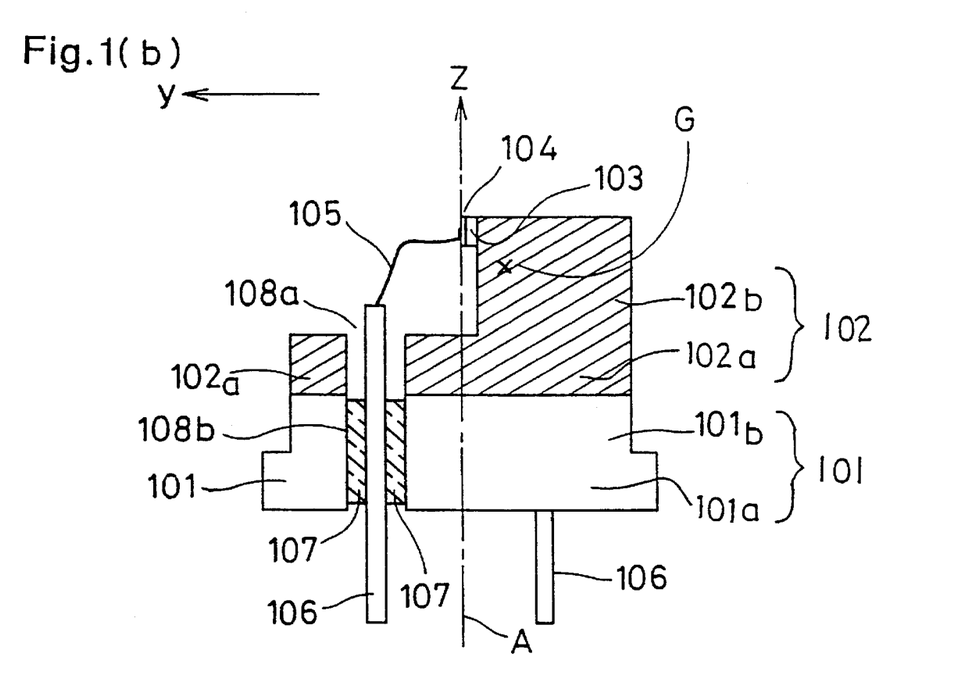

FIGS. 1(a) and 1(b) are, respectively, a perspective view and a sectional view illustrating a semiconductor light emitting device in accordance with a first embodiment of the present invention. In the figures, the same reference numerals as those of FIGS. 5, 6(a), and 6(b) designate the same or corresponding parts. Reference numeral 102 designates a silver block including a lower cylindrical part 102a and an upper semicircular cylindrical part 102b. The semicircular cylindrical part 102b is disposed on the cylindrical part 102a. Reference numerals 108a and 108b designate lead holes through which the leads 106 penetrate the iron stem 101 and the silver block 102.

The iron stem 101 has a diameter of 0.5 to 5.6 mm and a thickness of 1.0 to 2.0 mm and includes a cylinder 101b of smaller diameter disposed on a cylinder 101a of larger diameter with coincident central axes whereby the peripheral part of the stem 101 has a two step configuration so that, in a later process, a semiconductor laser module is easily attached. The lower cylindrical part 102a of the silver block 102 is fixed on the upper cylindrical part 101b of the iron stem 101 by soldering over the whole rear surface of the cylinder 102a. The cylindrical part 102a has a diameter of 0.5 to 5.6 mm and a height of 0.5 mm and the semicircular cylindrical part 102b has a height of 1.5 mm. The light emitting point 104 of the semiconductor laser device 103 having a width of 0.3 mm, a height of 0.5 mm, and a thickness of 0.1 mm is positioned on the central axis A of the iron stem 101 and also at the center of gravity G of the heat sink 102 or in the vicinity thereof.

There are provided three leads 106 that hold the iron stem 101 and the silver block 102. A lead 106a passes through the lead holes 108a and 108b and is connected to a front surface electrode 109 of the semiconductor laser device 103 via the bonding wire 105 and a lead 106b passes through the lead hole 108b and is connected to a rear surface electrode 110 of the semiconductor laser device 103 via the silver block 102. The leads 106 are fixed by melting the glass material 107 filling the lead holes 108b. The lead hole 108a of the silver block 102 is not filled with the glass material 107.

While iron is generally used as the material of the stem 101, an alloy, such as kovar, which includes iron as a main component, or including tungsten as a component may be used. Silver or copper having a large thermal conductivity is generally used as the material for the block 102. The thermal conductivity of copper is as shown in the following Table 2.

TABLE 2

| | copper |
|---|---|
| linear expansion coefficient | $0.162 \times 10^{-4}/°K.$ |
| thermal conductivity | 398 W/m °K. |
| specific electric conductivity | $0.599 \times 10^8$ S/m |

TABLE 2-continued

| | copper |
|---|---|
| Young's modulus | $110 \times 10^9$ N/m$^2$ |

The silver block 102 can be fixed to the stem 101 by soldering or silver soldering. While the silver block 102 has an L-shaped cross-section, as shown in FIG. 1(b), the shape is not restricted thereto so long as the light emitting point 104 of the semiconductor laser device 103 is positioned at the center of gravity G of the silver block 102 or in the vicinity thereof as well as on the central axis A of the iron stem 101. For example, the block 102 may have a generally U-shaped cross-section that has some part having a semi-circular cylindrical configuration remaining on the side opposite the semi-circular cylindrical configuration with only a part to which the semiconductor leaser device is to be fixed removed. The block 102 can also be produced by similarly processing a block of a prismatic configuration. In the extreme, the silver block 102, which has a true-circular cylinder configuration, has a small aperture in which the semiconductor laser device 103 can be mounted at the center of gravity G, which is the center of expansion of the block 102, or in the vicinity thereof.

Thus, the semiconductor light emitting device is fabricated so that the light emitting point 104 is positioned almost at the center of gravity G of the silver block 102 or in the vicinity thereof as well as on the central axis A of the iron stem 101. Expansion of the constitutional material due to temperature variation occurs mainly about the center of gravity G of the silver block 102, i.e., the light emitting point 104, as the center of expansion whereby the light emitting point 104 hardly moves. Therefore, when the laser beam output from the semiconductor light emitting device is made constant, a superior semiconductor laser module in which the laser beam output to the fiber hardly varies with temperature can be produced.

Embodiment 2

Figure 2:
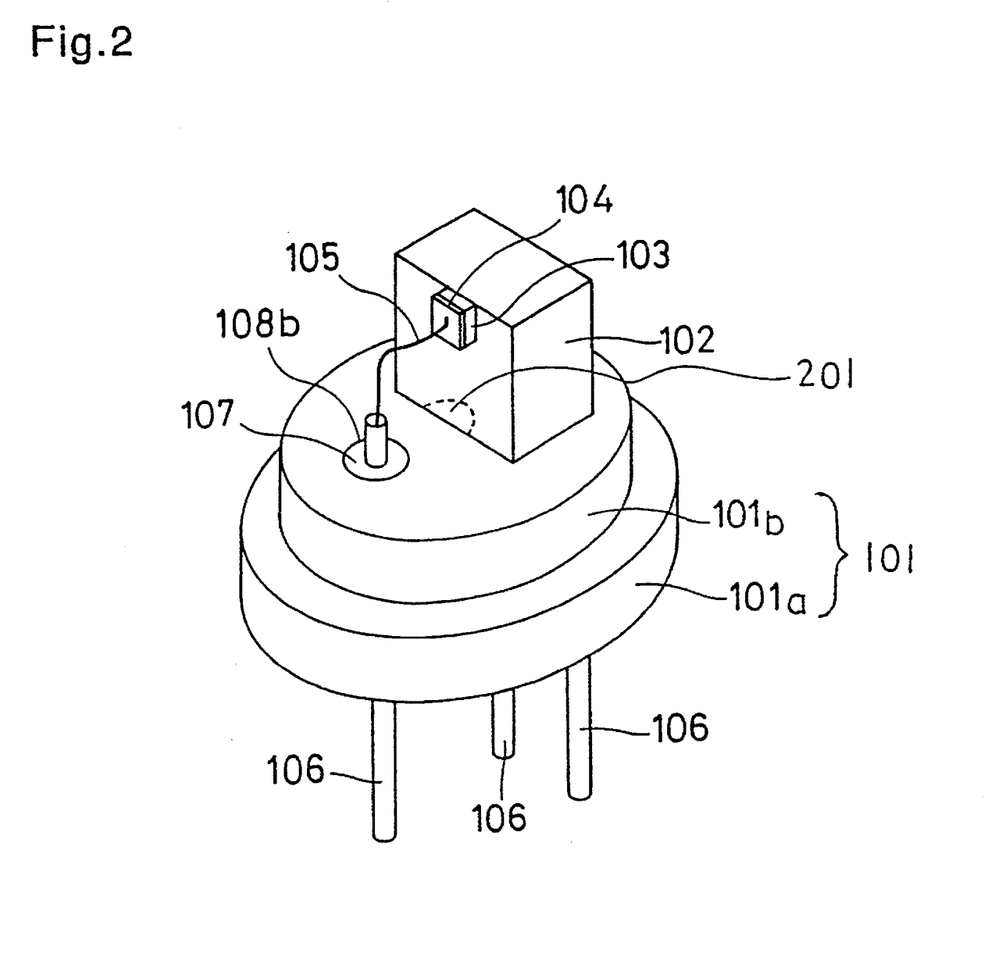
FIG. 2 is a perspective view illustrating a semiconductor light emitting device in accordance with a second embodiment of the present invention.
Figure 3A:
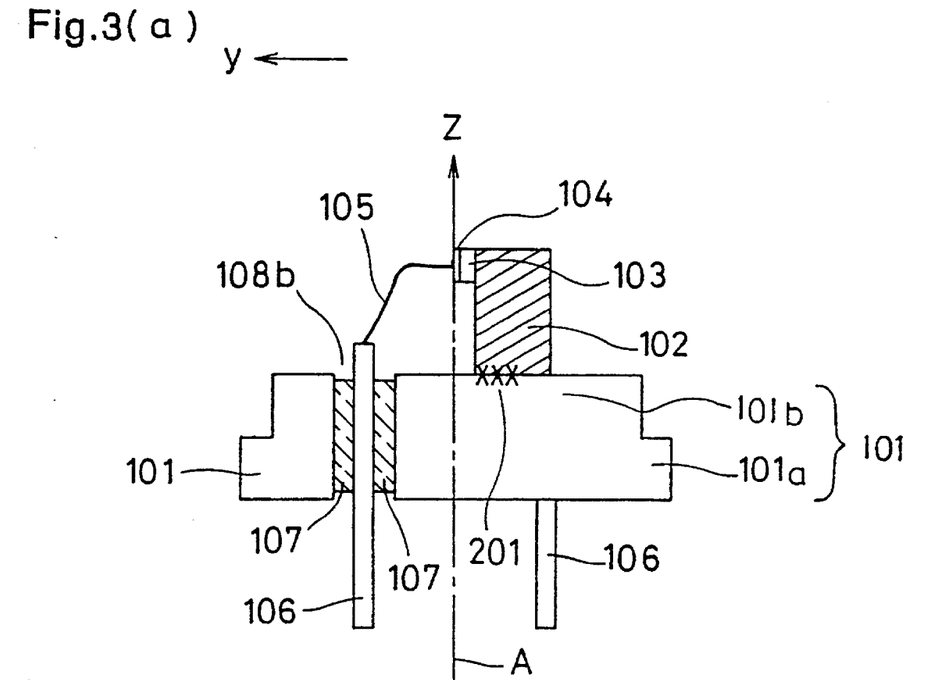
FIGS. 3(a) and 3(b) are sectional views illustrating a semiconductor light emitting device in accordance with the second embodiment of the present invention.
Figure 3B:
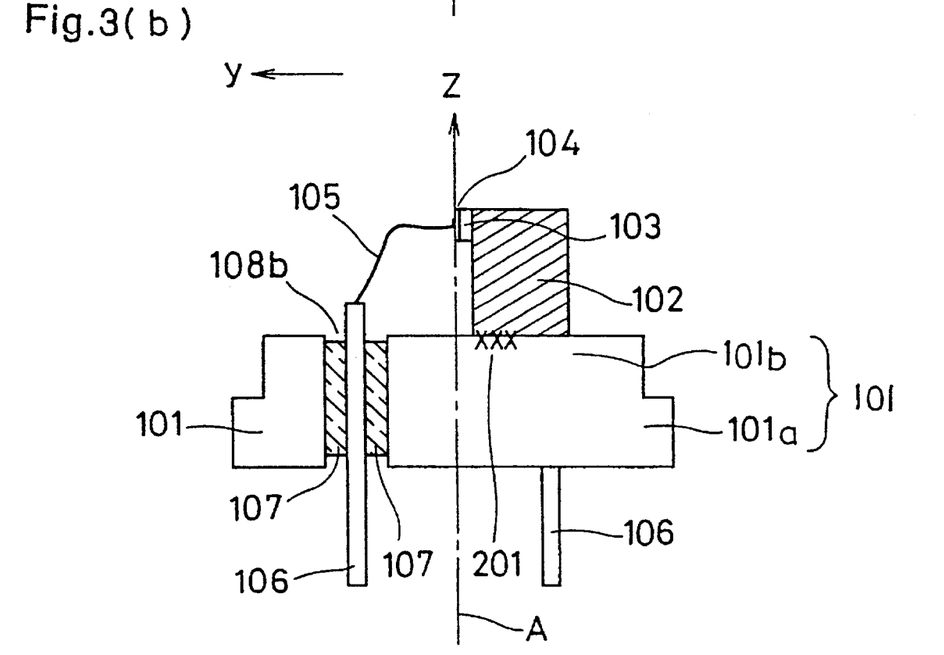

FIG. 2 is a perspective view illustrating a semiconductor light emitting device in accordance with a second embodiment of the present invention and FIGS. 3(a) and 3(b) are schematic cross-sectional views thereof. FIGS. 3(a) and 3(b) are cross-sectional views illustrating the semiconductor light emitting device before and after the silver block on the iron stem is thermally expanded by the heat of the semiconductor laser device, respectively. In the figures, the same reference numerals as those of FIGS. 5, 6(a), and 6(b) designate the same or corresponding parts. A soldered area 201 fixes the silver block 102 on the iron stem 101 and, for clarification, cross (X) marks on the surface indicate where the silver block 102 is soldered to the iron stem 101.

In this second embodiment, the silver block 102 is a rectangular parallelepiped having a width of 3.0 mm, a height of 2.0 mm, and a thickness of 2.0 mm fixed on the iron stem 101 having a cylindrical configuration body with a diameter of 0.5 to 5.6 mm and a thickness of 1.0 to 2.0 mm by soldering restricted to a narrow region in the vicinity of the central axis A of the iron stem 101. The semiconductor laser device 103 is soldered on the silver block 102 so that the light emitting point 104 of the semiconductor laser device 103 having a width of 0.3 mm, a height of 0.5 mm, and a thickness of 0.1 mm is positioned on the central axis of the iron stem 101.

The iron stem 101 includes the lead hole 108b through which the lead 106 comprising a Fe-Ni alloy of a diameter of 0.3 mm passes. The leads 106 are fixed by melting the glass material 107 filling the lead holes 108b. Three leads 106 hold the iron stem 101 and the silver block 102. A lead 106a passes through the lead hole 108b and is connected to a front surface electrode 109 of the semiconductor laser device 103 via the bonding wire 105 comprising Au and a lead 106b passes through the lead hole 108b and is connected to a rear surface electrode 110 of the semiconductor laser device 103 via the silver block 102.

In the above-described prior art device of FIGS. 5, 6(a), and 6(b), the soldered area 202 fixing the silver block 102 to the iron stem 101 covers the whole rear surface of the silver block 102. In this case, since solder covers the whole rear surface, expansion of the silver block 102 occurs isotropically and the light emitting point 104 of the semiconductor laser device 103 moves in the y direction.

On the other hand, in this second embodiment illustrated in FIGS. 2, 3(a), and 3(b), since the soldered area 201 is restricted to a small region in the vicinity of the central axis A of the iron stem 101, the silver block 102 is mainly expanded in the −y direction, and the movement δ of the light emitting point 104 of the semiconductor laser device 103 is suppressed to about half of that of the prior art device. Since the thickness of the silver block 102 in the y direction is generally several mm, in order to obtain the above-described effects of this second embodiment, the width of the soldered area 201 is less than about 1 mm.

When the path for radiating the heat generated in the semiconductor laser device 103 is considered, it is to some degree disadvantageous to restrict the soldered area 201 to a small region as in this second embodiment. However, in order to solve this problem, a metal that is easily plastically deformed may be disposed between the iron stem 101 and the silver block 102 where solder is not present. Indium or lead is used as such a metal.

Thus, in the semiconductor light emitting device according to this second embodiment, the light emitting point 104 of the semiconductor laser device 103 is positioned on the central axis A of the iron stem 101 and the surface 201 is only soldered to the iron stem 101 and the silver block 102 close to the central axis A of the iron stem 101. As a result, the movement of the light emitting point 104 due to thermal expansion is reduced, thereby providing a superior semiconductor light emitting device free of variation in the light output of the semiconductor laser even when temperature varies.

Embodiment 3

Figure 4A:
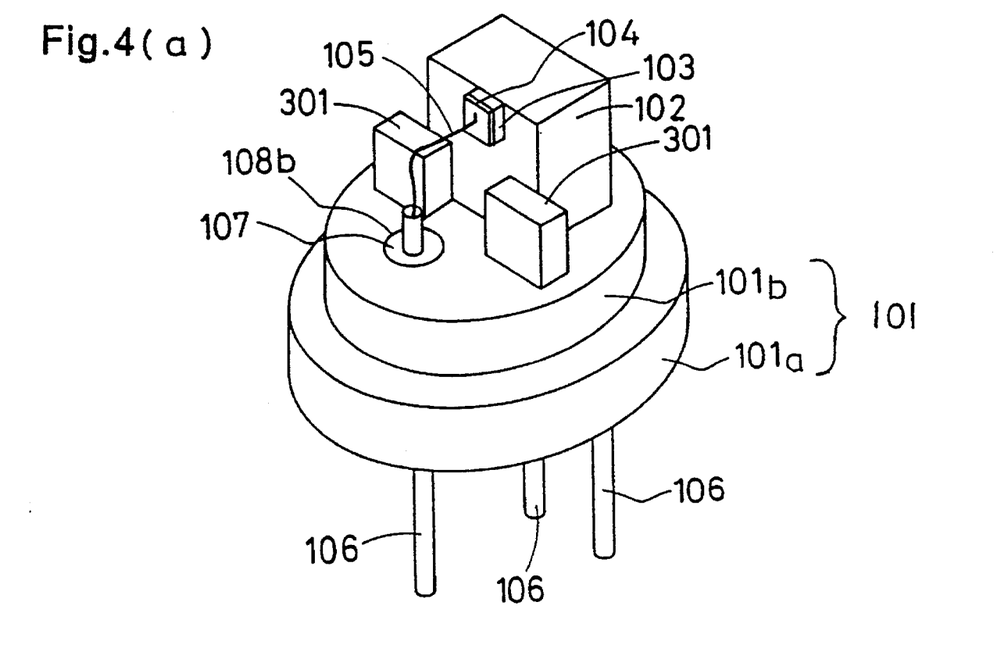
FIGS. 4(a) and 4(b) are, respectively, a perspective view and a plan view illustrating a semiconductor light emitting device in accordance with a third embodiment of the present invention.
Figure 4B:
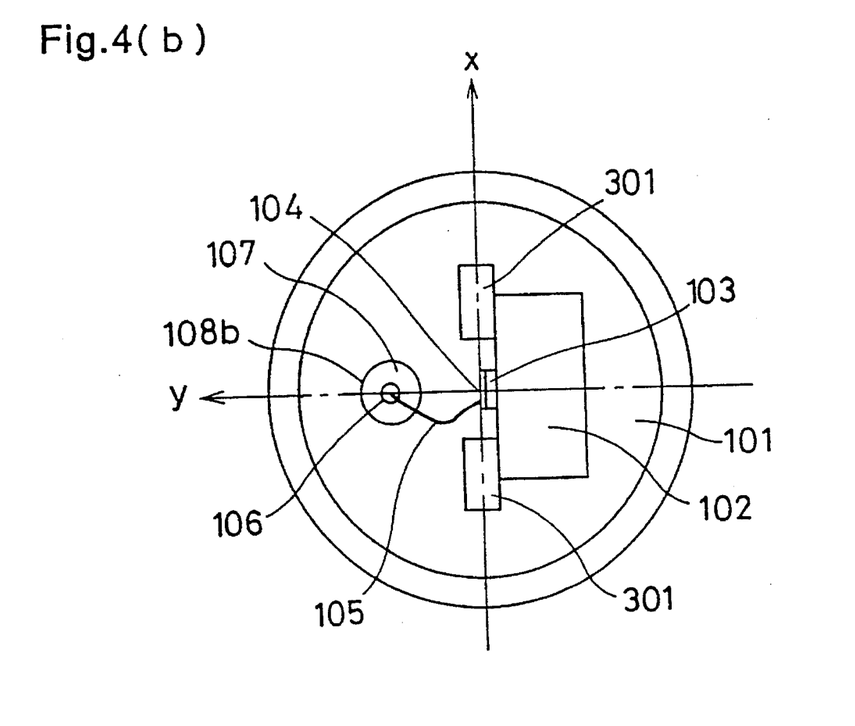

FIGS. 4(a) and 4(b) are, respectively, a perspective view and a plan view illustrating a semiconductor light emitting device in accordance with a third embodiment of the present invention. In the figures, the same reference numerals as those of FIGS. 5, 6(a), and 6(b) designate the same or corresponding parts. An expansion restricting stop 301 prevents expansion of the silver block. The expansion restricting stop 301 is made of iron and is in contact with the silver block 102 on the iron stem 101.

In this the embodiment, the silver block 102 has a rectangular parallelepiped shape having a width of 3.0 mm, a height of 2.0 mm, and a thickness of 2.0 mm and is fixed on the iron stem 101 having a circular pillar configuration, a diameter of 0.5 to 5.6 mm, and a thickness of 1.0 to 2.0 mm by soldering over the whole contact surface. The semiconductor laser device 103 is soldered to the silver block 102 so that the light emitting point 104 of the semiconductor laser device 103 having a width of 0.3 mm, a height of 0.5 mm, and a thickness of 0.1 mm is positioned on the central axis A of the iron stem 101.

The iron stem 101 includes the lead hole 108b through which the lead 106 comprising a Fe-Ni alloy having a diameter of 0.3 mm passes. The leads 106 are fixed by melting the glass material 107 filling the lead hole 108b. Three leads 106 hold the silver block 102 and the iron stem 101. A lead 106a passes through the lead hole 108b and is connected to a front surface electrode 109 of the semiconductor laser device 103 via the Au bonding wire 105 and a lead 106b passes through the lead hole 108b and is connected to a rear surface electrode 110 of the semiconductor laser device 103 via the silver block 102. The iron expansion restricting stop 301 that suppresses movement of the silver block 102 is located on the iron stem 101 in the vicinity of the central axis A of the iron stem 101 so that the light emitting point 104 cannot move even with the expansion of the silver block 102 toward the central axis A.

The main purpose of this third embodiment is to suppress the movement of the silver block 102 in the y direction due to thermal expansion. As illustrated in FIGS. 4(a) and 4(b), in the third embodiment, in order to suppress the expansion of the silver block 102 in the y direction, the expansion restricting pin 301 comprising the same material as the stem 101 is provided on the stem 101 and this pin 301 is pushed toward the silver block 102, thereby suppressing the thermal expansion of the silver block 102.

While the expansion restricting stop 301 has a prismatic configuration in FIGS. 4(a) and 4(b), the stop 301 may have a horseshoe-shaped pillar configuration. While iron is used as the material of the stop 301 in this embodiment, other materials having a large Young's modulus and a small expansion coefficient can be used.

In the third embodiment, the light emitting point 104 of the semiconductor laser device 103 is positioned on the central axis A of the iron stem 101 and the expansion restricting stop 301 for suppressing movement of the silver block 102 due to thermal expansion is in contact with the block 102 on the iron stem 101 at the side of the central axis A of the iron stem 101. As a result, the movement of the light emitting point 104 due to thermal expansion does not occur so that a semiconductor light emitting device having superior characteristics, i.e., that has no variation in semiconductor laser beam output even with temperature variation, is produced.

Embodiment 4

Figure 7:
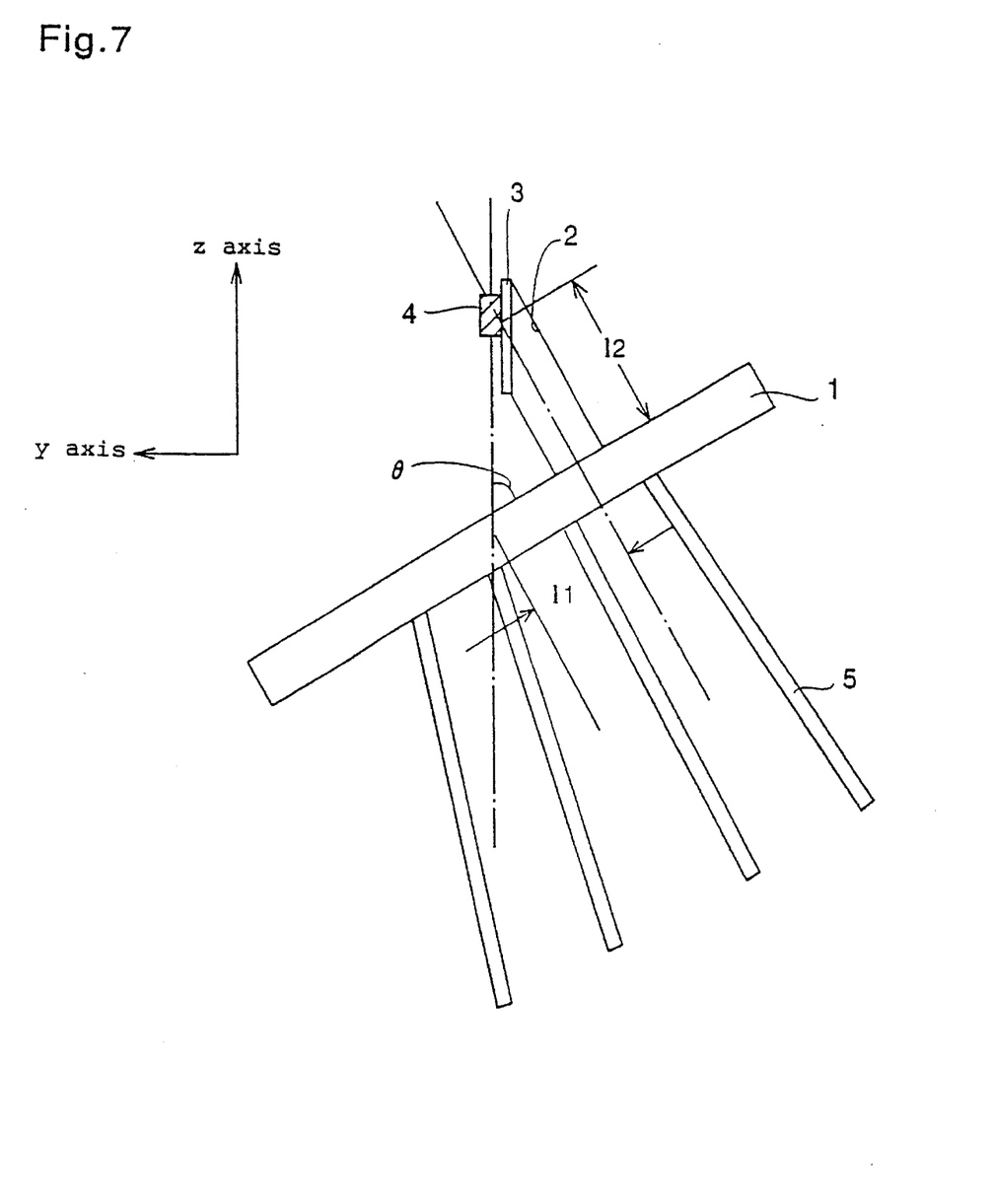
FIG. 7 is a diagram illustrating a structure of a semiconductor laser according to a fourth embodiment of the present invention.

FIG. 7 shows a fourth embodiment of the present invention where reference numerals the same as those shown in FIGS. 9(a) and 10 are used to designate the same or corresponding elements. In this fourth embodiment, the surface of the Fe stem 1 is inclined by an angle (θ) from the light emitting surface of the semiconductor laser chip 4 and the Ag block heat sink 2 is mounted on the stem 1. A semiconductor laser chip 4 is mounted on the stem via a cubic boron nitride submount 3.

In FIG. 7, reference character θ represents, as described above, an attachment inclination angle, an angle between the light emitted from the chip 4 and the surface of the package stem 1. When the Fe stem 1 having a linear expansion coefficient α1 and the Ag block 2 having a linear expansion coefficient α2 are employed and when the block 2 is attached to the stem 1 at a distance l1 from the center of the stem 1 and the thickness (height) of the block 2 is l2, $$\tan\theta = \frac{l2}{l1}.$$

In addition, movement in the y direction of the stem 1 caused by temperature variations is $l1 \cdot \alpha1 \cdot \Delta T \cdot \cos\theta$ and the movement in the y direction of the block 2 caused by temperature variations is $l2 \cdot \alpha2 \cdot \Delta T \cdot \sin\theta$.. Therefore, if these movements are to cancel, that is, if the position of the light emitting point in the y axis direction of the semiconductor laser chip 4 does not change because those movements cancel, then, without considering the linear expansion coefficient of the submount 3, $$\tan\theta = \frac{\sin\theta}{\cos\theta} = \frac{l1 \cdot \alpha1}{l2 \cdot \alpha2}$$

$$\therefore \frac{l2}{l1} = \frac{l1 \cdot \alpha1}{l2 \cdot \alpha2}, \therefore \left(\frac{l2}{l1}\right)^2 = \frac{\alpha1}{\alpha2}.$$

Accordingly, when the Fe stem 1 ($\alpha1=15 \times 10^{-6}/°C$.) and Ag block 2 ($\alpha2=20\times10^{-6}/°C$.) are employed, $$\frac{l2}{l1} = \frac{1.73}{2} = 0.865, (\theta + 40.9°).$$

In this fourth embodiment, by controlling the configurations of the stem 1 and the block 2, the positional deviation in the y direction of the laser chip is less than 0.0125 μm/deg. In other words, suppose that the distance from the center of the stem to the center of the block is 3 mm, the thermal expansion coefficient of the chip (light emitting point), as an effective total, is less than $4\times 10^{-6}$/deg because it thermally expands in the −y direction due to the stem and it retracts in the +y direction due to the block and, thereby, the positional deviation of the chip 4 in the y axis is eliminated.

Here, the value of less than $4\times10^6$/deg comes from supposing that the distance from the center of the stem to the center of the block is 3 mm. In order to suppress the deviation to less than 0.011 μm/deg, the thermal expansion coefficient is required to be less than 0.011 μm/3 mm=$3.66\times10^{-6}\rightarrow \approx 4\times10^{-6}$/deg.

In this fourth embodiment, the positional deviation of the light emitting point due to thermal expansion is reduced whereby tracking error is reduced.

Embodiment 5

In the fourth embodiment, by attaching the stem 1 and the block 2 in predetermined geometrical arrangements, the positional deviation of the point in the y axis direction is eliminated. However, the positional deviation of the chip 4 in the z axis direction is not yet eliminated.

Figure 8:
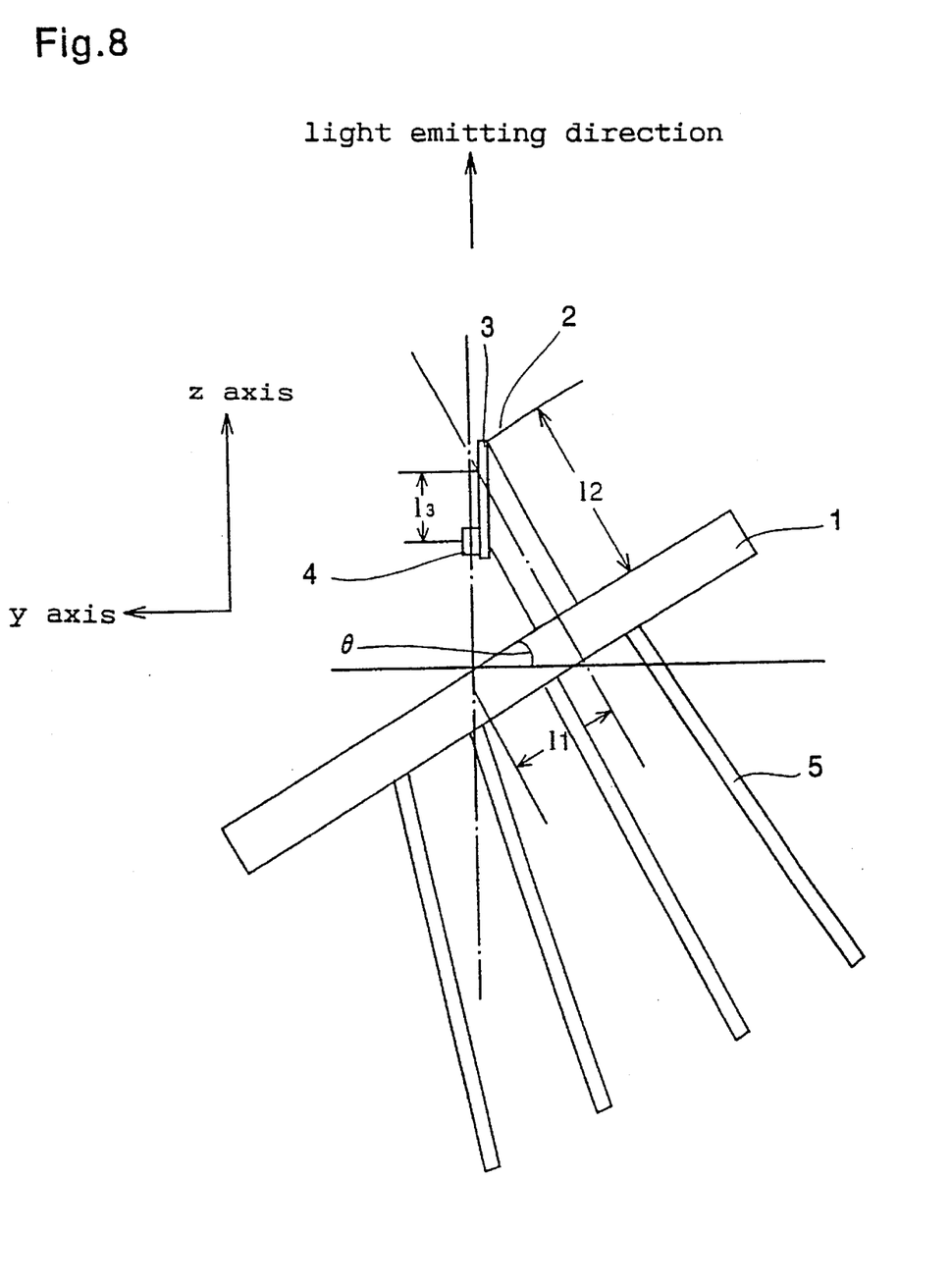
FIG. 8 is a diagram illustrating a semiconductor laser according to a fifth embodiment of the present invention.

A fifth embodiment of the present invention is directed to solving this problem. As illustrated in FIG. 8, the chip 4 is spaced from the center of the block 2 on the submount 3. The deviation in the z axis direction ($\alpha1.l1 \sin\theta + \alpha2 \cdot l2 \cos\theta$) $\Delta T$, and the deviation in its reverse direction ($\alpha3 \cdot l3 \cdot \Delta T$) due to the linear expansion coefficient of the submount 3 are made equal to each other.

In this fifth embodiment, the linear expansion coefficient of the submount 3 and the distance from the center of the block 2 to the attaching center of the chip 4 are set so that not only positional deviation in the y axis direction of the light emitting point but also positional deviation in the z axis direction of the light emitting point are eliminated.

In the above-described fourth and fifth embodiments, a semiconductor laser is described, but the same effects are also obtained for a light emitting diode.

As described above, according to a first embodiment, in a semiconductor light emitting device, the light emitting point of a semiconductor device is positioned at the center of gravity of a silver block or in the vicinity thereof as well as on the central axis of an iron stem. It is thereby possible to suppress movement of the light emitting point due to a difference in thermal expansion coefficients between the iron stem and the silver block, producing a semiconductor laser module that has only a small variation in the light output with temperature variations.

According to a second embodiment, the light emitting point of a semiconductor light emitting element is positioned on the central axis of the package stem and the silver block is mounted on the iron stem by soldering only at a region close to the central axis of the iron stem, resulting in a semiconductor light emitting device having a stable light output with suppressed movement of the position of the light emitting point due to temperature variations.

According to a third embodiment, the light emitting point of a semiconductor light emitting element is positioned on the central axis of the package stem and an expansion restricting stop contacts the silver block on the iron stem close to the central axis of the iron stem, thereby resulting in a semiconductor light emitting device having a stable light output with suppressed movement of the position of the light emitting point due to temperate variations.

According to the first to third embodiments, the advantage that the position of the light emitting point does not vary with temperature is achieved whereby a semiconductor laser device can be used for a long time even in an environment in which temperature is likely to vary and quite an advantageous semiconductor light emitting device with long term reliability is achieved.

According to a fourth embodiment of the present invention, a semiconductor light emitting device includes a semiconductor laser chip element mounted on a package stem via a heat sink. The semiconductor laser chip is mounted on the package stem via the heat sink so that the light emitted from the chip forms an angle θ with the surface of the package stem. The semiconductor laser chip is mounted on the stem via the heat sink so that the position of the light emitted from the chip does not vary with temperature changes.

According to a fifth embodiment of the present invention, in a semiconductor light emitting device, when the distance from the center of the surface of the package stem to a position of the stem where the heat sink is attached is l1, the height from the center of the package stem to a position on the heat sink where the semiconductor laser chip is attached is l2 and the linear expansion coefficients of the stem and the heat sink block are α1 and α2, respectively, $$\tan\theta = \frac{l2}{l1}, \quad \left(\frac{l2}{l1}\right)^2 = \frac{\alpha1}{\alpha2}.$$

Therefore, the positional deviation of the chip (light emitting point) due to thermal expansion and tracking error is reduced.

According to a sixth embodiment of the present invention, in a semiconductor light emitting device, the positional deviation in the light emitting direction of the light from the semiconductor laser chip of the semiconductor laser chip due to different linear expansion lengths between the package stem and the heat sink is compensated by the linear expansion of a submount between the semiconductor laser chip and the heat sink. Therefore, the positional deviation of the chip (light emitting point) due to thermal expansion is reduced whereby tracking error is reduced.

According to a seventh embodiment of the present invention, in a semiconductor light emitting device, when the linear expansion coefficient of the submount is α3 and the distance from the center of the heat sink on the surface of the submount to the attaching center of the semiconductor laser chip is l3, $$\alpha 1 \cdot l1\ \sin\Theta + \alpha 2 \cdot l2\ \cos\theta = \alpha 3 \cdot l3.$$

Therefore, the positional deviation of the light emitting point due to thermal expansion is reduced whereby tracking error is reduced.

What is claimed is:

1. A semiconductor light emitting device comprising:
   a package stem having a central axis;
   a radiating heatsink block having a center of mass and mounted on said package stem; and
   a semiconductor light emitting element having a light emitting point and mounted on said radiating heatsink block wherein the light emitting point of said semiconductor light emitting element is positioned on the central axis of said package stem and at the center of mass of said radiating heatsink block.

2. A semiconductor light emitting device comprising:
   a package stem having a central axis;
   a radiating heatsink block having a lower surface and mounted on said package stem; and
   a semiconductor light emitting element having a light emitting point and mounted on said radiating heatsink block wherein the light emitting point of said semiconductor light emitting element is positioned on the central axis of said package stem and only a part of the lower surface of said radiating heatsink block close to the central axis of said package stem is attached to said package stem;

3. A semiconductor light emitting device comprising:
   a package stem having a central axis.;
   a radiating heatsink block mounted on said package stem;
   a semiconductor light emitting element having a light emitting point and mounted on said radiating heatsink block wherein the light emitting point of said semiconductor light emitting element is positioned on the central axis of said package stem; and
   an expansion restricting stopper comprising a material different from said radiating heatsink block disposed on said package stem in contact with said radiating heatsink block.

4. A semiconductor light emitting device comprising:
   a package stem having a surface with a center;
   a radiating heatsink block mounted on the surface of said package stem; and
   a semiconductor laser chip element having a light emitting point and mounted on said radiating heatsink block wherein light emitted from said semiconductor laser chip element forms an acute angle θ with the surface of said package stem, wherein a distance from the center of the surface of said package stem measured along the surface to said radiating heatsink block is l1, a height from the center of the surface of said stem to said semiconductor laser chip element along said radiating heatsink block is l2, linear thermal expansion components of said package stem and said radiating heatsink block are α1 and α2, respectively, and $$\tan\theta = (l2/l1) \text{ and } ((l2/l1)^2) = (\alpha 1/\alpha 2).$$

5. A semiconductor light emitting device comprising:
   a package stem having a surface with a center;
   a radiating heatsink block mounted on the surface of said package stem;
   a semiconductor laser chip element having a light emitting point and mounted on said radiating heatsink block wherein light emitted from said semiconductor laser chid element forms an acute angle θ with the surface of said package stem; and
   a submount interposed between said semiconductor laser chip element and said radiating heat sink block wherein positional deviation in light emitted by said semiconductor laser chip element due to different linear thermal expansion lengths of said package stem and said radiating heatsink block is compensated by linear thermal expansion of said submount.

6. The semiconductor light emitting device of claim 5 wherein said submount has a linear thermal expansion coefficient of α3, a distance from a center of said radiating heatsink block on said submount to an attaching center of said semiconductor laser chip element on said submount is l3, and $$\alpha 1\ \ l1\ \sin\theta + \alpha 2 \cdot l2\ \cos\theta = \alpha 3 \cdot l3.$$

\* \* \* \* \*

UNITED STATES PATENT AND TRADEMARK OFFICE
CERTIFICATE OF CORRECTION

PATENT NO. : 5,519,720
DATED : May 21, 1996
INVENTOR(S) : Hirano et al.

It is certified that error appears in the above-indentified patent and that said Letters Patent is hereby corrected as shown below:

Column 13, Line 42, change ";" to --.--;

Line 44, after "axis" delete --.--.

Signed and Sealed this

Thirteenth Day of August, 1996

Attest:

BRUCE LEHMAN

Attesting Officer    Commissioner of Patents and Trademarks